United States Patent
Kuo (10) Patent No.: US 8,724,362 B2
(45) Date of Patent: May 13, 2014

(54) TRANSISTOR CIRCUIT LAYOUT STRUCTURE

(71) Applicant: Etron Technology, Inc., Hsinchu (TW)

(72) Inventor: Ming-Hong Kuo, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 40 days.

(21) Appl. No.: 13/645,456

(22) Filed: Oct. 4, 2012

(65) Prior Publication Data
US 2013/0088907 A1  Apr. 11, 2013

Related U.S. Application Data

(60) Provisional application No. 61/544,288, filed on Oct. 7, 2011.

(51) Int. Cl.
*G11C 5/06* (2006.01)

(52) U.S. Cl.
USPC .......................................... 365/63; 365/149

(58) Field of Classification Search
USPC .................................................. 365/63, 149
See application file for complete search history.

(56) References Cited

U.S. PATENT DOCUMENTS

| 6,399,979 B1 * | 6/2002 | Noble et al. ............... 257/302 |
| 8,184,472 B2 * | 5/2012 | Anderson et al. .......... 365/149 |
| 2010/0002494 A1 * | 1/2010 | Xiong et al. ............... 365/149 |

* cited by examiner

*Primary Examiner* — Huan Hoang
(74) *Attorney, Agent, or Firm* — Winston Hsu; Scott Margo (57) ABSTRACT

A transistor circuit layout structure includes a transistor disposed on a substrate and including a source terminal, a drain terminal and a split gate including an independent first block and an independent second block, a bit line disposed on the source terminal and on the drain terminal or embedded in the substrate, a word line disposed on the first block, and a back line disposed on the second block. The horizontal level of the back line is different from that of the bit line and the word line.

20 Claims, 9 Drawing Sheets

TRANSISTOR CIRCUIT LAYOUT STRUCTURE

CROSS REFERENCE TO RELATED APPLICATIONS

This application claims the benefit of U.S. Provisional Application Ser. No. 61/544,288, filed Oct. 7, 2011.

BACKGROUND OF THE INVENTION

1. Field of the Invention

The present invention generally relates to a transistor circuit layout structure. Specific words, the present invention is directed to a transistor circuit layout structure which is capable of accommodating more circuits to control transistors in addition to bit lines and word lines.

2. Description of the Prior Art

A transistor structure is a metal oxide semiconductor (MOS) which includes a gate as well as at least two sets of doped regions, respectively serving as a drain or a source. A metal oxide semiconductor transistor controls the transistor to switch on or off by a word line which is electrically connected to the gate. The source of the metal oxide semiconductor is electrically connected to a capacitor to form a memory structure unit, called a dynamic random access memory. In the dynamic random access memory, the drain is electrically connected to a bit line to form a current path, and to achieve the purposes of data storage or input through a storage node which is electrically connected to a capacitor via the source.

In the current dynamic random access memory processes, the capacitors are usually designed to be either a stacked capacitor which is stacked on the substrate surface, or a deep trench capacitor which is buried in the substrate. No matter what kind of the dynamic random access memory is involved, there is only one gate which is in charge of controlling the switch on or off of the gate channel which is buried in the substrate.

With the trends toward miniaturization of electronic products, the design of the dynamic random access memory elements must meet the requirements of high-integration and high density. In order to promote the dynamic random access memory devices to have good performance, the possible leak current should be reduced to become as low as possible. In view of this, a new transistor circuit layout structure is still needed to accommodate more circuits to control transistors in addition to bit lines and word lines to further reduce the costs and to be more popular.

SUMMARY OF THE INVENTION

Given the above, the present invention proposes a novel transistor circuit layout structure. The new transistor circuit layout structure of the present invention may accommodate more circuits to control transistors in addition to the coherent bit lines and word lines to further enhance the performance of the dynamic random access memory, to reduce the leak current and to be more advantageous.

The present invention in a first aspect proposes a transistor circuit layout structure. The transistor circuit layout structure of the present invention includes a substrate, a transistor, a bit line, a word line and a back line. The transistor is disposed on the substrate and includes a source terminal, a drain terminal and a split gate with an independent first block and with an independent second block. The bit line is disposed on the source terminal and on the drain terminal, electrically connected to the drain terminal and extends along a first direction. The word line is disposed on the first block, electrically connected to the first block and extends along the first direction. The back line is disposed on the second block, electrically connected to the second block and extends along a second direction. In particular, a horizontal level of the back line is different from that of the bit line and from that of the word line.

In one embodiment of the present invention, the first direction is substantially perpendicular to the second direction.

In another embodiment of the present invention, the first direction is parallel with the second direction.

In another embodiment of the present invention, the horizontal level of the back line is higher than that of the bit line and that of the word line.

In another embodiment of the present invention, the horizontal level of the back line is lower than that of the bit line and that of the word line.

In another embodiment of the present invention, the transistor is disposed in a DRAM memory unit. The DRAM memory unit includes a first strip semiconductor material, the split gate, a first dielectric layer, a first gate dielectric layer and a first capacitor unit. The first strip semiconductor material is disposed on the substrate and extends along the first direction. The split gate is disposed on the substrate and extends along a third direction to divide the first strip semiconductor material into a first source terminal, a first drain terminal and a first channel region. The first direction may be substantially perpendicular to the second direction, or the first direction may cross but not be perpendicular to the second direction. The first dielectric layer is at least partially sandwiched between the split gate and the substrate. The first gate dielectric layer is at least partially sandwiched between the split gate and the strip semiconductor material. The first capacitor unit is disposed on the substrate and includes the first source terminal serving as a bottom electrode, a second dielectric layer at least partially covering the first source terminal to serve as a capacitor dielectric layer, and a capacitor metal layer at least partially covering the second dielectric layer to serve as a top electrode.

In another embodiment of the present invention, the capacitor metal layer extends along the third direction to form an electrode line disposed on the substrate.

In another embodiment of the present invention, the horizontal level of the electrode line is lower than that of the back line, that of the bit line and that of the word line.

In another embodiment of the present invention, the DRAM memory unit further includes a second strip semiconductor material, a second gate dielectric layer and a second capacitor unit. The second strip semiconductor material is disposed on the substrate and extends along the first direction. The split gate further includes a third block so that the second block and the third block together divides the second strip semiconductor material into a second source terminal, a second drain terminal and a second channel region. The second gate dielectric layer is at least partially sandwiched between the split gate and the second strip semiconductor material. The second capacitor unit is electrically connected to the second source terminal so that the first strip semiconductor material, the second strip semiconductor material, the split gate, the first capacitor unit and the second capacitor unit together form a dynamic memory unit. In particular, the first strip semiconductor material and the second strip semiconductor material together share an electrode line.

In another embodiment of the present invention, the bit line is disposed on the first capacitor unit.

The present invention in a second aspect proposes another transistor circuit layout structure. The transistor circuit layout structure of the present invention includes a substrate, a transistor, a bit line, a word line and a back line. The transistor is disposed on the substrate and includes a source terminal, a drain terminal and a split gate with an independent first block and with an independent second block. The bit line is buried in the substrate, electrically connected to the drain terminal and extends along a first direction. The word line is disposed on the first block, electrically connected to the first block and extends along the first direction. The back line is disposed on the second block, electrically connected to the second block and extends along a second direction. In particular, a horizontal level of the back line is different from that of the word line.

In one embodiment of the present invention, the first direction is substantially perpendicular to the second direction.

In another embodiment of the present invention, the first direction is parallel with the second direction.

In another embodiment of the present invention, the horizontal level of the back line is higher than that of the word line.

In another embodiment of the present invention, the horizontal level of the back line is lower than that of the word line.

In another embodiment of the present invention, the transistor is disposed in a DRAM memory unit. The DRAM memory unit includes a first strip semiconductor material, the split gate, a first dielectric layer, a first gate dielectric layer and a first capacitor unit. The first strip semiconductor material is disposed on the substrate and extends along the first direction. The split gate is disposed on the substrate and extends along a third direction to divide the first strip semiconductor material into a first source terminal, a first drain terminal and a first channel region. The first direction may be substantially perpendicular to the third direction, or the first direction may cross but be not perpendicular to the third direction. The first dielectric layer is at least partially sandwiched between the split gate and the substrate. The first gate dielectric layer is at least partially sandwiched between the split gate and the first strip semiconductor material. The first capacitor unit is disposed on the substrate and includes the first source terminal serving as a bottom electrode, a second dielectric layer at least partially covering the first source terminal to serve as a capacitor dielectric layer, and a capacitor metal layer at least partially covering the second dielectric layer to serve as a top electrode.

In another embodiment of the present invention, the capacitor metal layer extends along the third direction to form an electrode line disposed on the substrate.

In another embodiment of the present invention, the horizontal level of the electrode line is lower than that of the back line and that of the word line.

In another embodiment of the present invention, the DRAM memory unit further includes a second strip semiconductor material, a second gate dielectric layer and a second capacitor unit. The second strip semiconductor material is disposed on the substrate and extends along the first direction. The split gate further includes an independent third block so that the second block and the third block together divide the second strip semiconductor material into a second source terminal, a second drain terminal and a second channel region. The second gate dielectric layer is at least partially sandwiched between the split gate and the second strip semiconductor material. The second capacitor unit is electrically connected to the second source terminal so that the first strip semiconductor material, the second strip semiconductor material, the split gate, the first capacitor unit and the second capacitor unit together form a dynamic memory unit. In particular the first strip semiconductor material and the second strip semiconductor material together share an electrode line.

In another embodiment of the present invention, the bit line is disposed under the first capacitor unit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 illustrate various examples of the transistor circuit layout structures of the present invention.

DETAILED DESCRIPTION

The present invention provides a transistor circuit layout structure. To further reduce the leak current of the dynamic random access memory and to be more advantageous, the new transistor circuit layout structure of the present invention has additional circuits to control the leak current in addition to the coherent bit lines and word lines. FIG. 1 to FIG. 9 illustrate various examples of the transistor circuit layout structures of the present invention. For example, the bit line may be disposed on the source terminal and on the drain terminal, or may be buried in the substrate. The horizontal level of the back line is different from that of the bit line and from that of the word line. Or, the back line may be parallel with, perpendicular to, or crossing but not perpendicular to the bit line.

Figure 1:
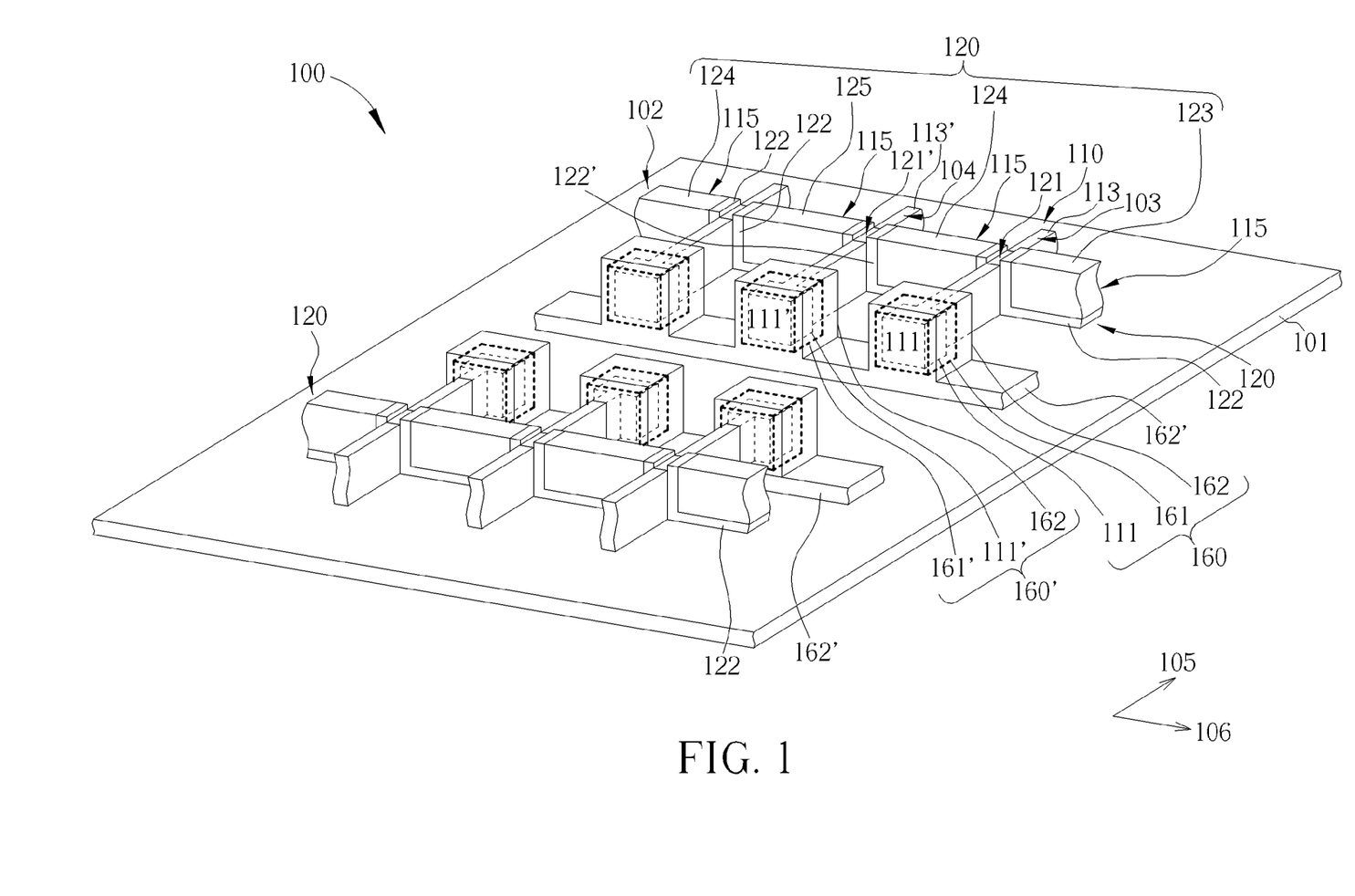
FIG. 1 illustrates a first example of the transistor circuit layout structures of the present invention.

Please refer to FIG. 1, which illustrates a first example of the transistor circuit layout structures of the present invention. The transistor circuit layout structure 100 of the present invention at least includes a substrate 101, a transistor 110, a split gate 120, a word line 130, a bit line 140, a back line 150 and a first capacitor unit 160. Merely for the purpose of clear illustrations, the word line 130, the bit line 140, and the back line 150 are not shown.

The substrate 101 may be a conductive Si substrate such as a Si-containing substrate, a semiconductor substrate such as a III-V group on silicon (GaN-on-silicon for instance), a graphene-on-silicon or a silicon-on-insulator (SOI), an insulating silicon substrate, or a combination thereof. The transistor 110 is disposed on the substrate 101 and includes a source, a drain and a split gate 120.

In one embodiment of the present invention, as shown in FIG. 1, the transistor 110 is disposed in a DRAM memory unit 102. The DRAM memory unit 102 includes a first strip semiconductor material 103, the split gate 120, a first gate dielectric layer 122 and a first capacitor unit 160.

The first strip semiconductor material 103 is at least partially disposed above the substrate 101 and extends along a first direction 105. Besides, an insulating material such as a shallow trench isolation (STI) maybe disposed nearby or inbetween to surround the first strip semiconductor material 103. The first strip semiconductor material 103 may include Si material, such as single crystal Si, and be obtained by etching or epitaxial. Because the substrate 101 may be a conductive Si substrate or a silicon-on-insulator substrate, the first strip semiconductor material 103 may be electrically connected to the substrate 101 or electrically insulated from the substrate 101. In FIG. 1 of the first example, the substrate 101 is a bulk of Si substrate so the first strip semiconductor material 103 is electrically connected to the substrate 101.

On the other hand, the split gate 120 is disposed on the substrate 101 and extends along the second direction 106. As shown in FIG. 1, the split gate 120 includes at least an independent first block 123 and an independent second block 124. Optionally, there may be more blocks present, such as a third block 125. Due to the first block 123 and the second block 124, the first strip semiconductor material 103 is divided into a first source terminal 111, a first drain terminal 113 and a first channel region 121.

In one embodiment of the present invention, the first strip semiconductor material 103, the first source terminal 111 and the first drain terminal 113 are integrally formed. Further, the first source terminal 111 may be electrically connected to the first capacitor unit 160. In another embodiment of the present invention, the first direction 105 may be substantially perpendicular to the second direction 106. Or alternatively, the first direction 105 crosses the second direction 106 but the first direction 105 is substantially not perpendicular to the second direction 106.

In still another embodiment of the present invention, the dimension of the first source terminal 111 may be larger than both the dimensions of the first drain terminal 113 and of the first channel region 121 so the first source terminal 111 and the first drain terminal 113 may have relatively asymmetric shapes. For example, the source width of the first source terminal 111 along the second direction 106 is larger than the first channel region width of the first strip semiconductor material 103 along the second direction 106, and larger than the drain width of the first drain terminal 113 along the second direction 106 as well. As a result, the first source terminal 111, the first drain terminal 113 and the first channel region 121 together form a T shape and the first source terminal 111 is the larger terminal in dimension.

A first gate dielectric layer 122 is at least partially sandwiched between the split gate 120 and the first strip semiconductor material 103, to become a gate dielectric layer of the split gate 120 to control the first channel region 121. In addition, the first gate dielectric layer 122 may also extend and be at least partially sandwiched between the substrate 101 and the first strip semiconductor material 103 to become a first dielectric layer. Preferably, the first gate dielectric layer 122 may be a high k material with a dielectric constant larger than that of silicon oxide, such as hafnium oxide, ($HfO_2$), hafnium silicon oxide, ($HfSiO_4$), hafnium silicon oxynitride, (HfSiON), aluminum oxide, ($Al_2O_3$), lanthanum oxide, ($La_2O_3$), tantalum oxide, ($Ta_2O_5$) or the combination thereof.

The first capacitor unit 160 of the transistor 110 of the present invention is disposed on the surface of the substrate 101 together with the first source terminal 111, and the first source terminal 111 becomes part of the first capacitor unit 160. For example, the first capacitor unit 160 may include the first source terminal 111, a second dielectric layer 161 as well as a capacitor metal layer 162 so that first capacitor unit 160 may has a capacitance of at least 5 pF.

First, the first source terminal 111 may serve as the bottom electrode of the first capacitor unit 160. Second, the second dielectric layer 161 at least partially covers the first source terminal 111 to serve as the capacitor dielectric layer of the first capacitor unit 160. For example, the second dielectric layer 161 covers at least one side of the first source terminal 111, or the second dielectric layer 161 covers two sides, three sides, four sides or up to five sides of the first source terminal 111. The second dielectric layer 161 preferably has a high k material with a dielectric constant larger than that of silicon oxide. Third, the capacitor metal layer 162 at least partially covers the second dielectric layer 161 to serve as a top electrode of the first capacitor unit 160.

For example, the capacitor metal layer 162 may completely cover the second dielectric layer 161 and the first source terminal 111. In another embodiment of the present invention, both the first dielectric layer 122 and the second dielectric layer 161 may be of the same high k material, preferably made in the same high k material process. Taking the gate-last for high-K last process for example, the first gate dielectric layer 122 and the split gate 120 may be fabricated along with the capacitor metal layer 162 and the second dielectric layer 161 at the same stage. Or alternatively, the first gate dielectric layer 122 and the second dielectric layer 161 may be of different high k materials.

The split gate 120 of the present invention may include a conductive material such as poly-Si, silicide or a metal, and forms a gate structure together with the first gate dielectric layer 122. In one preferred embodiment of the present invention, one of the first block 123 and the second block 124 of the split gate 120 is a drive gate while the other is a back gate, to respectively control the same gate channel 121, so they have excellent capability to control the "on/off" state of the first channel region 121.

The advantages of the drive gate and the back gate to control the same gate channel 121 reside in that the drive gate and the back drive are provided with a positive voltage at the same time when the first channel region 121 is "on" so there is sufficient current to provide correct storage signals. The back drive is provided with a negative voltage when the first channel region 121 is "off" to compensate the insufficiency of the drive gate to minimize the leakage current as well as to provide longer retention time.

Because the bit line 140 is electrically connected to the first drain terminal 113 for use in reading and writing of signals, the word line 130 is electrically connected to the drive gate 123 in the split gate 120, and a back drive line 150 is electrically connected to the back gate 124 to reduce the leak current to become as low as possible, at least three circuits which are mutually electrically insulated from one another may be accommodated in the transistor circuit layout structure 100 of the present invention.

Please refer to FIG. 2 to FIG. 5, which illustrate a serious of examples of the transistor circuit layout structure in accordance with FIG. 1. The word line 130, the bit line 140 and the back line 150 are introduced in the examples and the bit line 140 may be disposed on the source terminal and on the drain terminal. The word line 130 which extends along a first direction 105 is disposed on a first block 123 (i.e. on the drive gate 123) and electrically connected to a first block 123 through a downward drive plug 130a to control all the drive gates 123 which are electrically connected to the word line 130. The capacitor metal layer 162 is disposed on the substrate 101 and optionally extends along a second direction 106.

Figure 2:
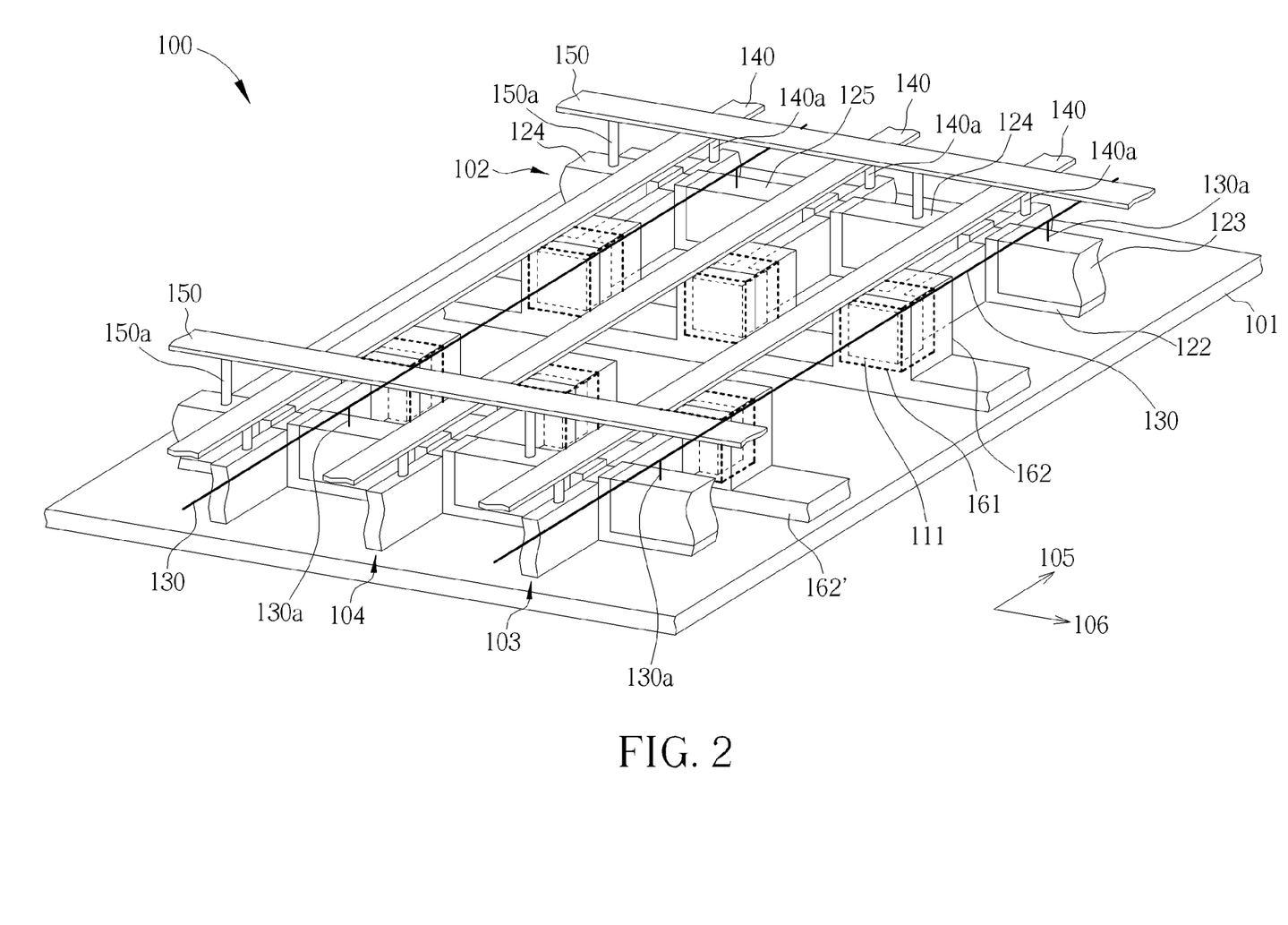
FIG. 2 to FIG. 5 illustrate a serious of examples of the transistor circuit layout structure of the present invention in accordance with FIG. 1. The bit line is disposed on the source terminal and on the drain terminal.
Figure 3:
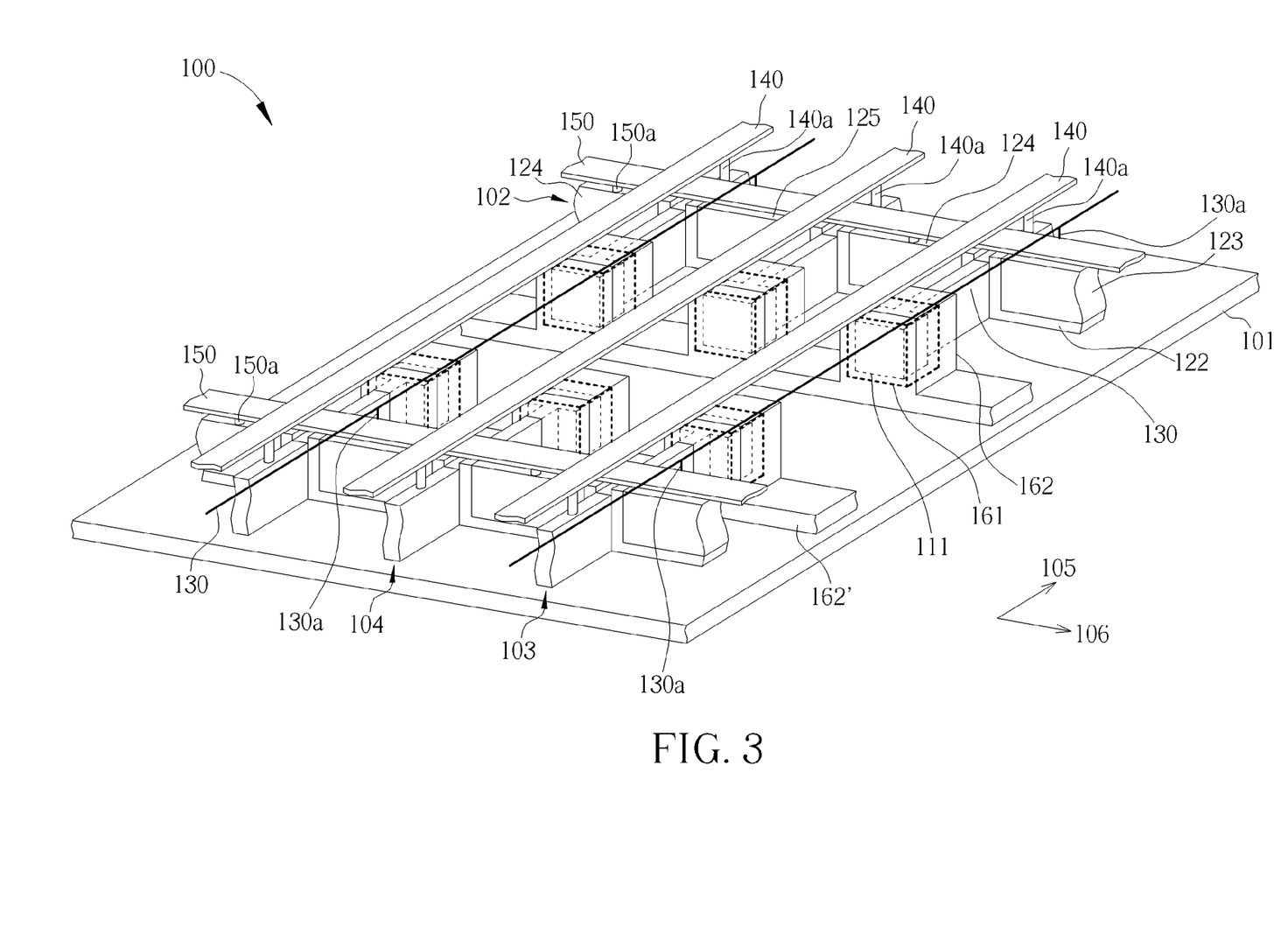

In the second example as shown in FIG. 2, the bit line 140 which extends along the first direction 105 is disposed on the corresponding source and drain (for example the first source terminal 111 and first drain terminal 113) and electrically connected to a drain terminal through a downward drain plug 140a to control all the drains which are electrically connected to the bit line 140. The back line 150 which extends along the second direction 106 is disposed on a second block 124 (i.e. on the back gate 124) and electrically connected to a second block 124 through a downward back plug 150a to control all the back gates 124 which are electrically connected to the back line 150 to reduce the leakage current to become as low as possible and to provide longer retention time. The capacitor metal layer 162, the word line 130, the bit line 140 and the back line 150 may be electrically insulated from one another by means of a conventional interlayer dielectric layer (ILD, not shown).

In the second example as shown in FIG. 2, the word line 130 may be substantially perpendicular to the back line 150, or the word line 130 may cross the back line 150 but is not perpendicular to the back line 150. The horizontal level of the back line 150 is higher than that of the bit line 140 and that of the word line 130 at the same time. Please refer to FIG. 3. In a third example of the present invention, the horizontal level of the back line 150 is lower than that of the bit line 140 and that of the word line 130 at the same time.

Figure 4:
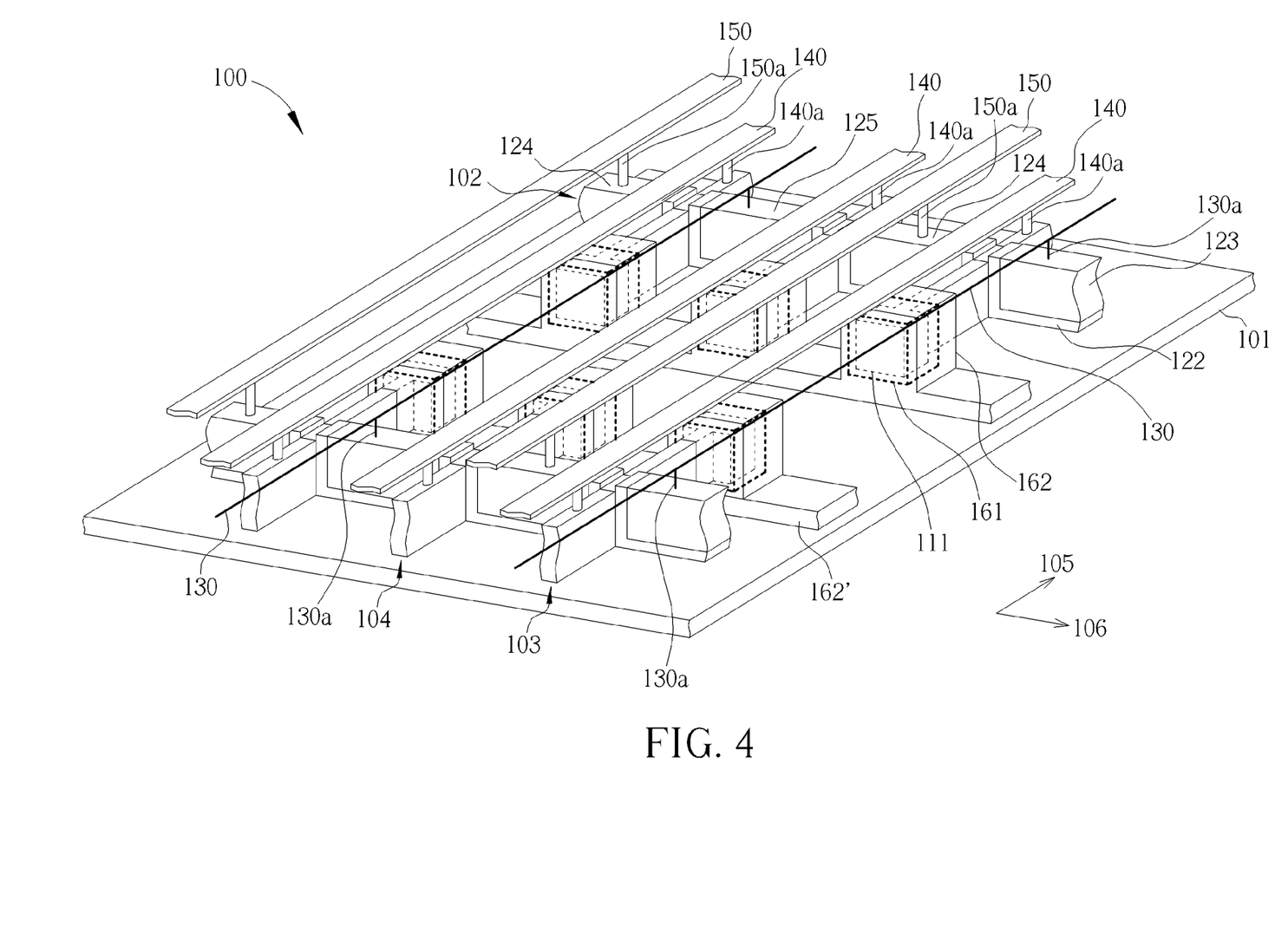
Figure 5:
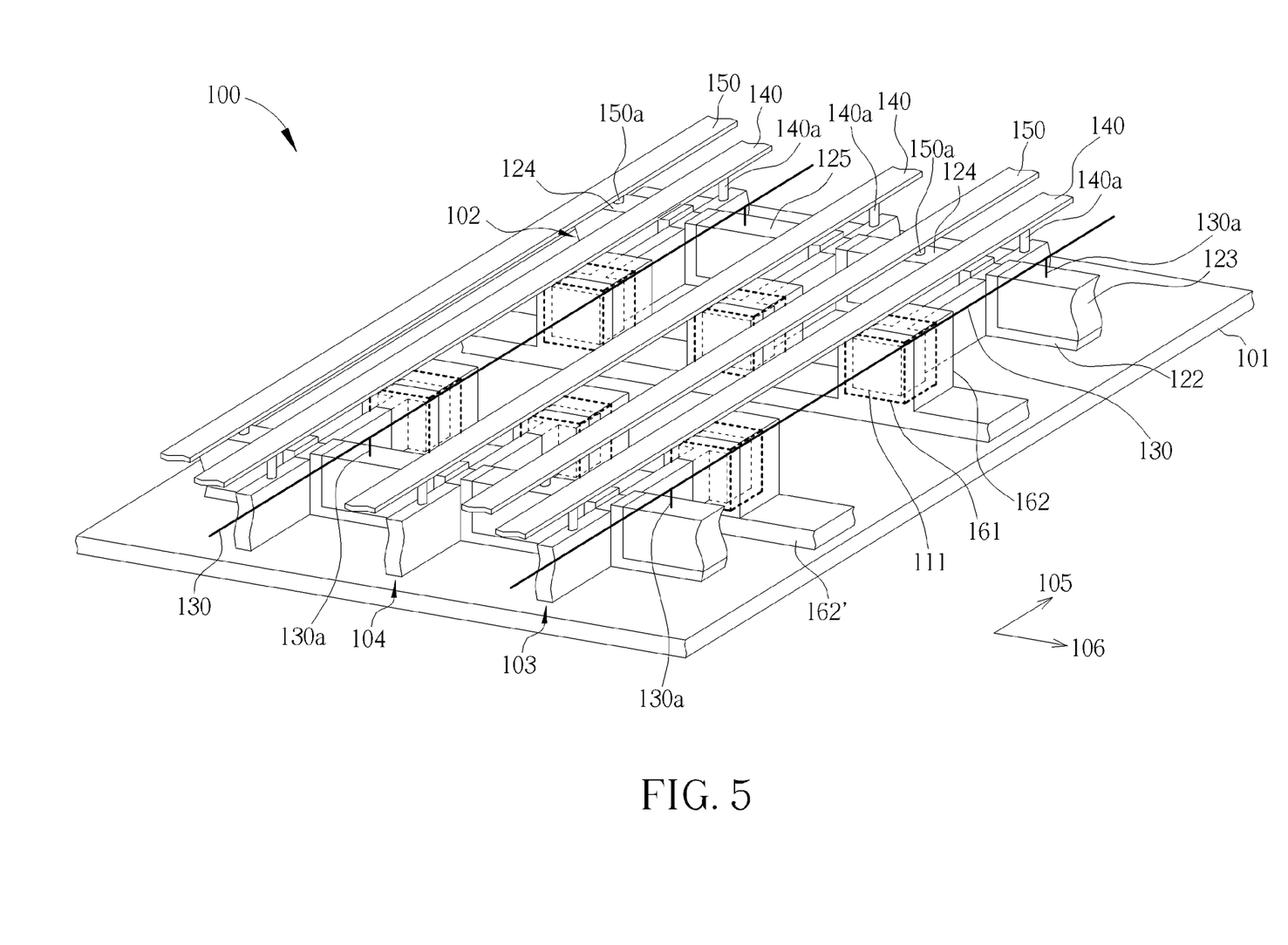

Please refer to FIG. 4. In a fourth example of the present invention, the back line 150 may extend along the first direction 105 so that the back line 150 is substantially parallel with the word line 130, and the horizontal level of the back line 150 maybe higher than that of the bit line 140 and that of the word line 130 at the same time. Please refer to FIG. 5. In a fifth example of the present invention, the horizontal level of the back line 150 may be lower than that of the bit line 140 and that of the word line 130 at the same time.

Please refer to FIG. 6 to FIG. 9, which illustrate another serious of examples of the transistor circuit layout structure of the present invention in accordance with FIG. 1. The word line 130, the bit line 140 and the back line 150 are also introduced in the examples, and the bit line 140 may be buried in the substrate 101 to reduce the layout circuit density above the substrate 101. The word line 130 which extends along a first direction 105 is disposed on a first block 123 (i.e. on the drive gate 123) and electrically connected to a first block 123 through a downward drive plug 130a to control all the drive gates 123 which are electrically connected to the word line 130. The capacitor metal layer 162 is disposed on the substrate 101 and optionally extends along a second direction 106.

Figure 6:
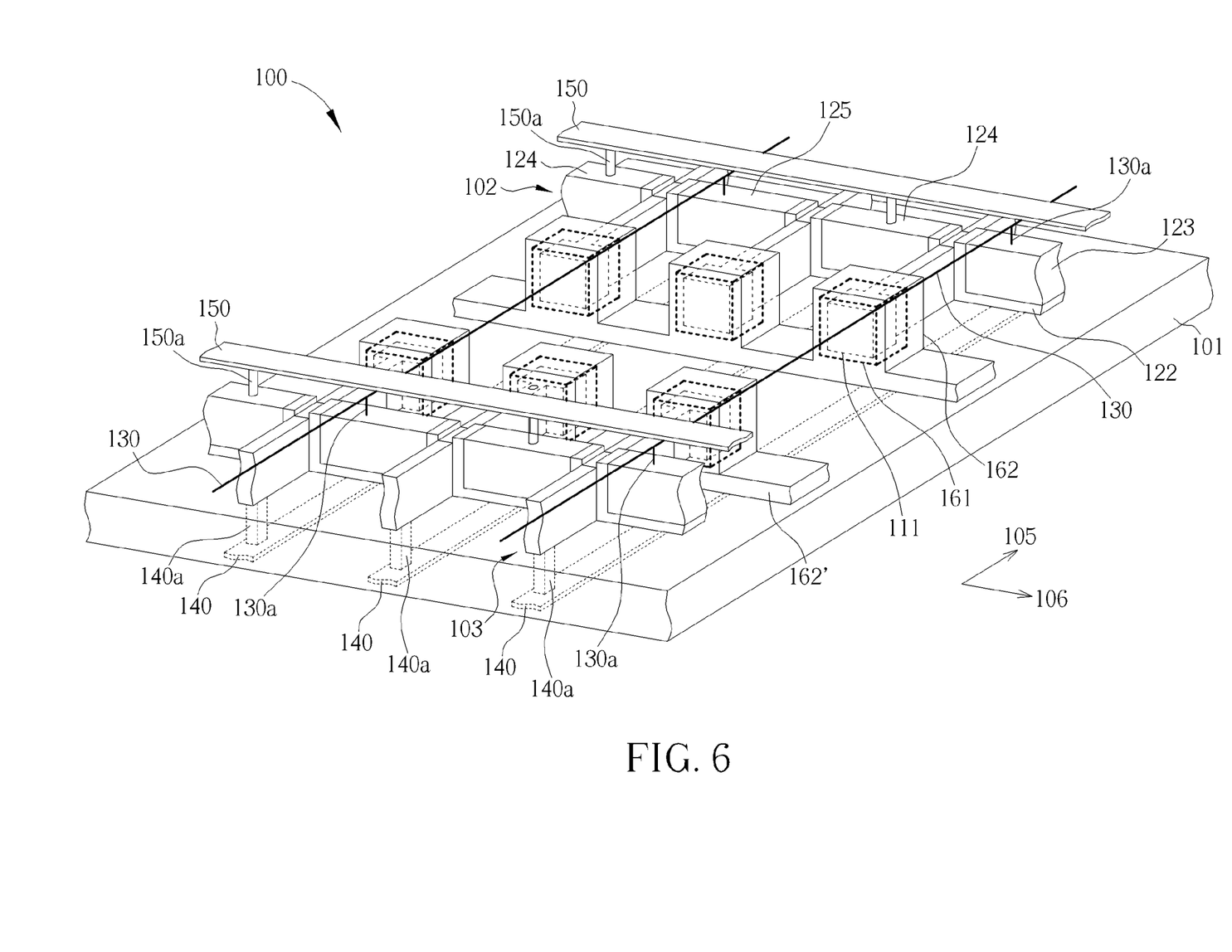
FIG. 6 to FIG. 9 illustrate another serious of examples of the transistor circuit layout structure of the present invention in accordance with FIG. 1. The bit line is buried in the substrate.
Figure 7:
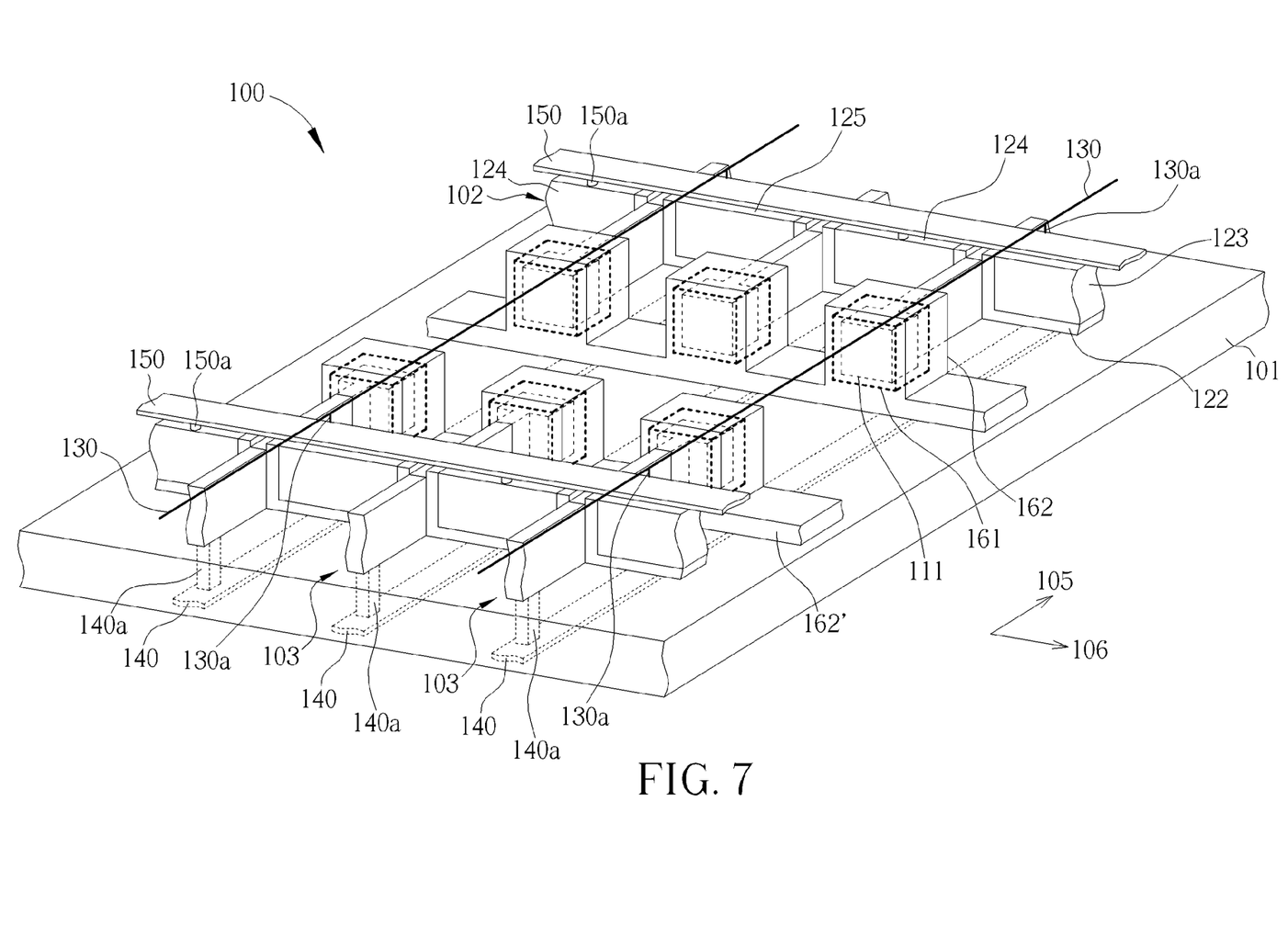

In the second example as shown in FIG. 6, the bit line 140 which extends along the first direction 105 is buried in the substrate 101 and disposed under the corresponding source and drain (for example the first source terminal 111 and first drain terminal 113) and electrically connected to a drain terminal through a upward drain plug 140a to control all the drains which are electrically connected to the bit line 140. The back line 150 which extends along the second direction 106 is disposed on a second block 124 (i.e. on the back gate 124) and electrically connected to a second block 124 through a downward back plug 150a to control all the back gates 124 which are electrically connected to the back line 150 to reduce the leakage current to become as low as possible and to provide longer retention time. The capacitor metal layer 162, the word line 130 and the back line 150 may be electrically insulated from one another by means of a conventional interlayer dielectric layer (ILD, not shown).

In the sixth example as shown in FIG. 6, the word line 130 may be substantially perpendicular to the back line 150, or the word line 130 may cross the back line 150 but is not perpendicular to the back line 150. The horizontal level of the back line 150 may be higher than that of the bit line 140 and that of the word line 130 at the same time (since the bit line 140 is buried in the substrate 101). Please refer to FIG. 7. In a seventh example of the present invention, the horizontal level of the back line 150 may be lower than that of the word line 130 but higher than that of the bit line 140 at the same time.

Figure 8:
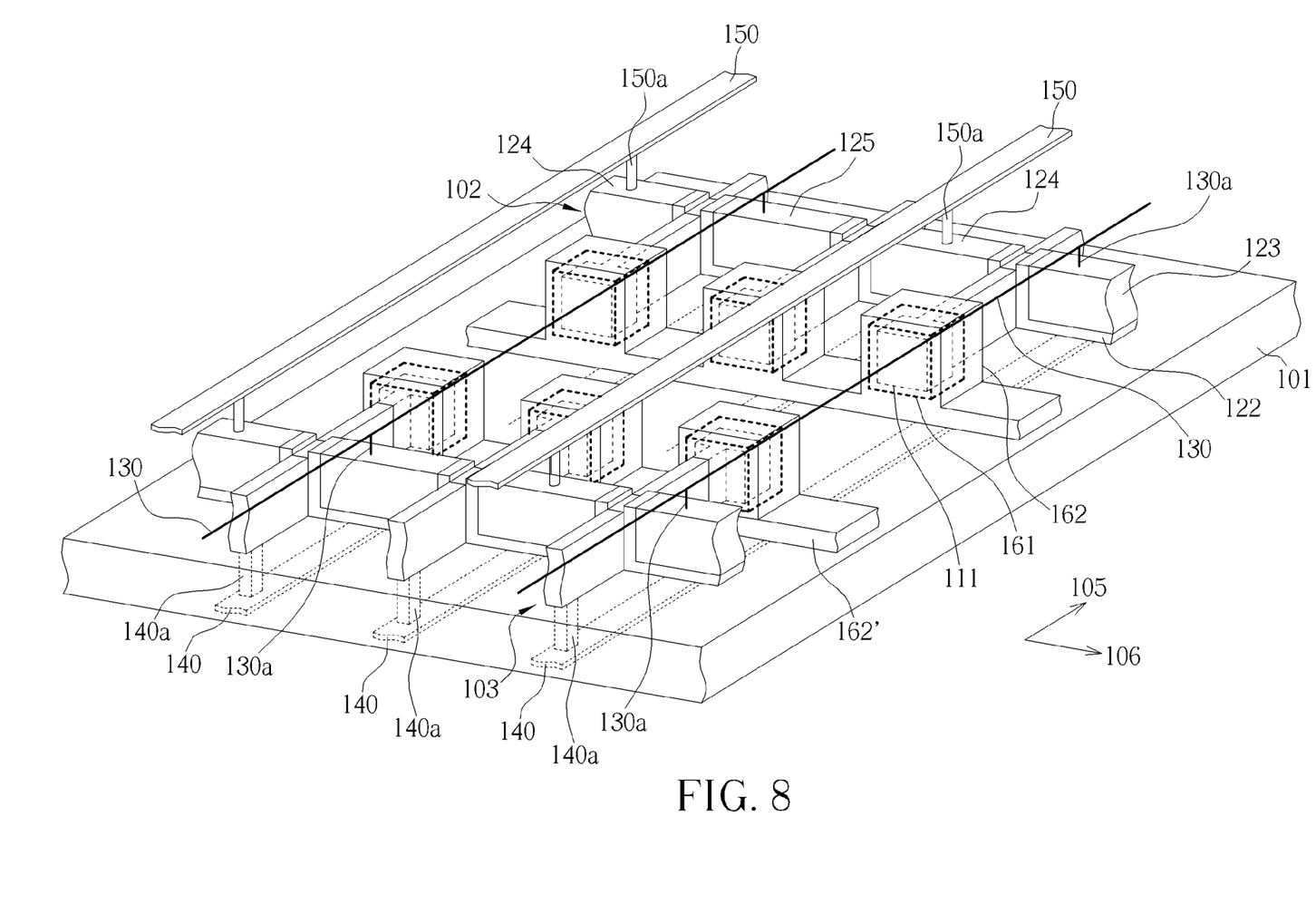
Figure 9:
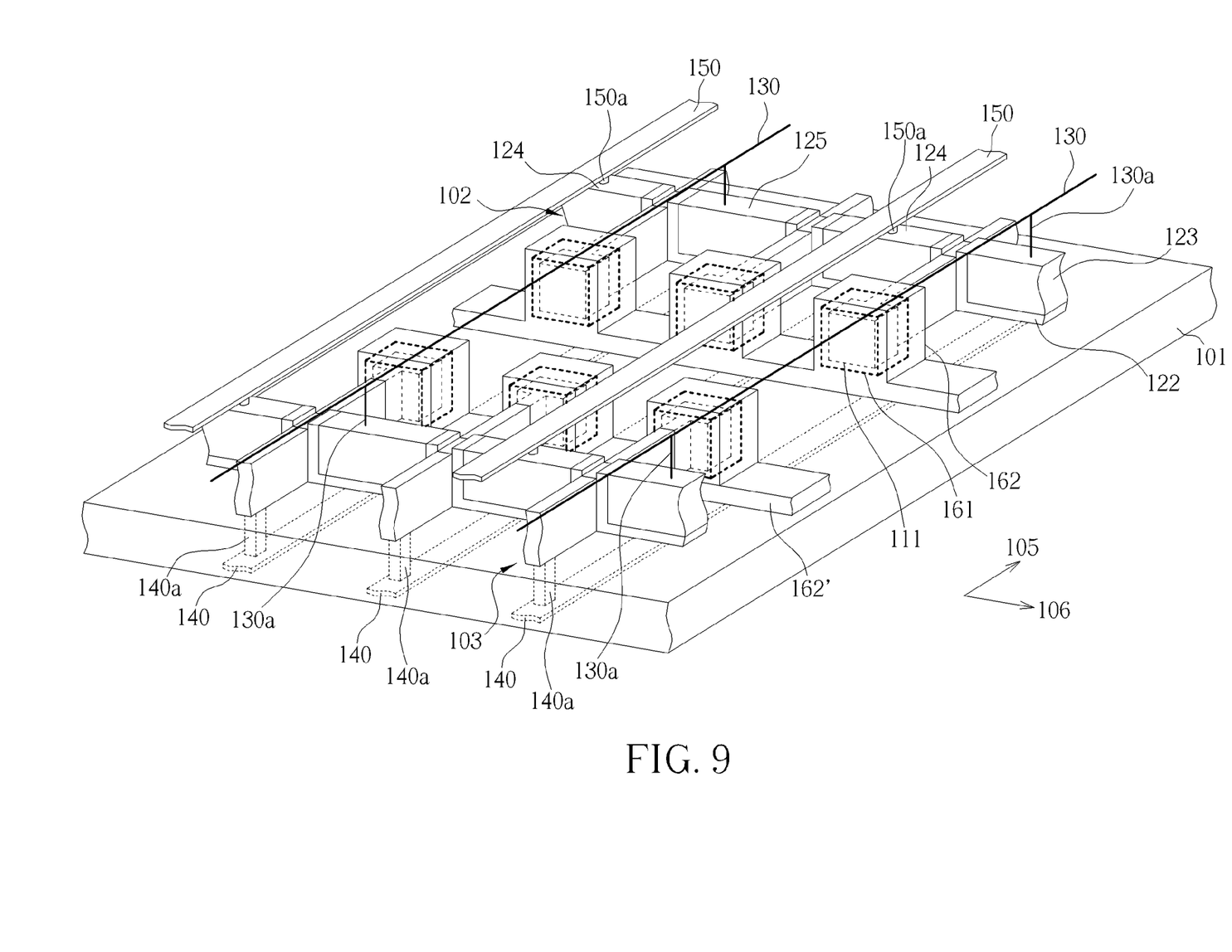

Please refer to FIG. 8. In an eighth example of the present invention, the back line 150 may also extends along the first direction 105 so that the back line 150 is substantially parallel with the word line 130, and the horizontal level of the back line 150 is higher than that of the bit line 140 and that of the word line 130 at the same time. Please refer to FIG. 9. In a ninth example of the present invention, the horizontal level of the back line 150 may be lower than that of the word line 130 but higher than that of the bit line 140 at the same time.

Please refer to FIG. 2 to FIG. 9. In another embodiment of the present invention, the capacitor metal layer 162 may also extend along the second direction 106 to form an electrode line 162' disposed on the substrate 101. In this embodiment, please refer to FIG. 2 to FIG. 5, the horizontal level of the electrode line 162' is lower than that of the bit line 140, that of the back line 150 and that of the word line 130 at the same time. Or alternatively, please refer to FIG. 6 to FIG. 9, the horizontal level of the electrode line 162' is lower than that of the back line 150 and that of the word line 130, but higher than that of the bit line 140 (since the bit line 140 is buried in the substrate 101) at the same time.

Please refer to FIG. 1. In still another embodiment of the present invention, the dynamic memory unit 102 further includes a second strip semiconductor material 104, a second gate dielectric layer 122' and a second capacitor unit 160'. The dynamic memory unit 102 of the present invention may possibly have three or more strip semiconductor materials.

The second strip semiconductor material 104 is also disposed on the substrate 101 and extends along the first direction 105. The split gate 120 may further include a third independent block 125 so that the second block 124 and the third block 125 together divide the second strip semiconductor material 104 into a second source terminal 111', a second drain terminal 113' and a second channel region 121'. The second gate dielectric layer 122' is at least partially sandwiched between the split gate 120 and the second strip semiconductor material 104. The second capacitor unit 160' is electrically connected to the second source terminal 111' so that the first strip semiconductor material 103, the second strip semiconductor material 104, the split gate 120, the first capacitor unit 160 and the second capacitor unit 160' together form the dynamic memory unit 102.

Since the dynamic memory unit 102 includes the first capacitor unit 160 and the second capacitor unit 160' at the same time, and the capacitor metal layer 162 may possibly extend along the second direction 106, the capacitor metal layer 162 may electrically connect the first capacitor unit 160 and the second capacitor unit 160' to become an electrode line 162' which the first capacitor unit 160 and the second capacitor unit 160' together share, to control all the capacitor units which the electrode line 162' electrically connects. The bit line 140 may be disposed on the first capacitor unit 160. In yet another embodiment of the present invention, as shown in FIG. 2, the bit line 140 may pass over the first capacitor unit 160, or as shown in FIG. 6, the bit line 140 may pass under the first capacitor unit 160.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor circuit layout structure, comprising:
   a substrate;
   a transistor disposed on said substrate and comprising a source terminal, a drain terminal and a split gate comprising a first block and a second block;

a bit line disposed on said source terminal and on said drain terminal, electrically connected to said drain terminal and extending along a first direction;
a word line disposed on said first block, electrically connected to said first block and extending along said first direction; and
a back line disposed on said second block, electrically connected to said second block and extending along a second direction, wherein a horizontal level of said back line is different from that of said bit line and from that of said word line.

2. The transistor circuit layout structure of claim 1, wherein said first direction is substantially perpendicular to said second direction.

3. The transistor circuit layout structure of claim 1, wherein said first direction is parallel with said second direction.

4. The transistor circuit layout structure of claim 1, wherein the horizontal level of said back line is higher than that of said bit line and that of said word line.

5. The transistor circuit layout structure of claim 1, wherein the horizontal level of said back line is lower than that of said bit line and that of said word line.

6. The transistor circuit layout structure of claim 1, wherein said transistor is disposed in a DRAM memory unit comprising:
a first strip semiconductor material disposed on said substrate and extending along said first direction;
said split gate disposed on said substrate and extending along a third direction to divide said first strip semiconductor material into a first source terminal, a first drain terminal and a first channel region, wherein said first direction is one of being substantially perpendicular to and crossing but not perpendicular to said third direction;
a first dielectric layer at least partially sandwiched between said split gate and said substrate;
a first gate dielectric layer at least partially sandwiched between said split gate and said strip semiconductor material; and
a first capacitor unit disposed on said substrate and comprising said first source terminal serving as a bottom electrode, a second dielectric layer at least partially covering said first source terminal to serve as a capacitor dielectric layer and a capacitor metal layer at least partially covering said second dielectric layer to serve as a top electrode.

7. The transistor circuit layout structure of claim 6, wherein said capacitor metal layer extends along said third direction to form an electrode line disposed on said substrate.

8. The transistor circuit layout structure of claim 7, wherein the horizontal level of said electrode line is lower than that of said back line, that of said bit line and that of said word line.

9. The transistor circuit layout structure of claim 6, wherein said DRAM memory unit further comprising:
a second strip semiconductor material disposed on said substrate and extending along said first direction, wherein said split gate further comprises a third block so that said second block and said third block together divide said second strip semiconductor material into a second source terminal, a second drain terminal and a second channel region;
a second gate dielectric layer at least partially sandwiched between said split gate and said second strip semiconductor material; and
a second capacitor unit electrically connected to said second source terminal so that said first strip semiconductor material, said second strip semiconductor material, said split gate, said first capacitor unit and said second capacitor unit together form a dynamic memory unit, wherein said first strip semiconductor material and said second strip semiconductor material together share an electrode line.

10. The transistor circuit layout structure of claim 6, wherein said bit line is disposed on said first capacitor unit.

11. A transistor circuit layout structure, comprising:
a substrate;
a transistor disposed on said substrate and comprising a source terminal, a drain terminal and a split gate comprising a first block and a second block;
a bit line buried in said substrate, electrically connected to said drain terminal and extending along a first direction;
a word line disposed on said first block, electrically connected to said first block and extending along said first direction; and
a back line disposed on said second block, electrically connected to said second block and extending along a second direction, wherein a horizontal level of said back line is different from that of said word line.

12. The transistor circuit layout structure of claim 11, wherein said first direction is substantially perpendicular to said second direction.

13. The transistor circuit layout structure of claim 11, wherein said first direction is parallel with said second direction.

14. The transistor circuit layout structure of claim 11, wherein the horizontal level of said back line is higher than that of said word line.

15. The transistor circuit layout structure of claim 11, wherein the horizontal level of said back line is lower than that of said word line.

16. The transistor circuit layout structure of claim 11, wherein said transistor is disposed in a DRAM memory unit comprising:
a first strip semiconductor material disposed on said substrate and extending along said first direction;
said split gate disposed on said substrate and extending along a third direction to divide said first strip semiconductor material into a first source terminal, a first drain terminal and a first channel region, wherein said first direction is one of being substantially perpendicular to, and crossing but being not perpendicular to said third direction;
a first dielectric layer at least partially sandwiched between said split gate and said substrate;
a first gate dielectric layer at least partially sandwiched between said split gate and said first strip semiconductor material; and
a first capacitor unit disposed on said substrate and comprising said first source terminal serving as a bottom electrode, a second dielectric layer at least partially covering said first source terminal to serve as a capacitor dielectric layer, and a capacitor metal layer at least partially covering said second dielectric layer to serve as a top electrode.

17. The transistor circuit layout structure of claim 16, wherein said capacitor metal layer extends along said third direction to form an electrode line disposed on said substrate.

18. The transistor circuit layout structure of claim 17, wherein the horizontal level of said electrode line is lower than that of said back line and that of said word line.

19. The transistor circuit layout structure of claim 16, wherein said DRAM memory unit further comprising:
a second strip semiconductor material disposed on said substrate and extending along said first direction, wherein said split gate further comprises a third block so that said second block and said third block together divide said second strip semiconductor material into a second source terminal, a second drain terminal and a second channel region;

a second gate dielectric layer at least partially sandwiched between said split gate and said second strip semiconductor material; and a second capacitor unit electrically connected to said second source terminal so that said first strip semiconductor material, said second strip semiconductor material, said split gate, said first capacitor unit and said second capacitor unit together form a dynamic memory unit, wherein said first strip semiconductor material and said second strip semiconductor material together share an electrode line.

20. The transistor circuit layout structure of claim 19, wherein said bit line is disposed under said first capacitor unit.

\* \* \* \* \*